(12) United States Patent
Linzer et al.

(10) Patent No.: US 7,710,800 B2
(45) Date of Patent: May 4, 2010

(54) MANAGING REDUNDANT MEMORY IN A VOLTAGE ISLAND

(75) Inventors: Harry I Linzer, Raleigh, NC (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 11/954,479

(22) Filed: Dec. 12, 2007

(65) Prior Publication Data

US 2009/0154269 A1    Jun. 18, 2009

(51) Int. Cl.
*G11C 7/00* (2006.01)
(52) U.S. Cl. .................. 365/200; 365/201; 365/189.09; 365/189.05
(58) Field of Classification Search ............. 365/200, 365/201, 189.09, 189.05, 210.1
See application file for complete search history.

(56) References Cited

U.S. PATENT DOCUMENTS

| | | | |
|---|---|---|---|
| 6,992,937 B2 * | 1/2006 | Tran et al. | 365/200 |
| 7,051,306 B2 | 5/2006 | Hoberman et al. | |
| 2007/0109882 A1 | 5/2007 | Taniguchi et al. | |

* cited by examiner

*Primary Examiner*—David Lam
(74) *Attorney, Agent, or Firm*—W. Riyon Harding; Hoffman Warnick LLC

(57) ABSTRACT

An approach that manages redundant memory in a voltage island is described. In one embodiment there is a design structure embodied in a machine readable medium used in a design process of a semiconductor device. In this embodiment, the design structure includes one or more voltage islands representing a power cycled region. One or more non-power cycled regions are located about the one or more voltage islands. Each of the one or more non-power cycled regions comprises at least one memory using redundancy and a repair register associated with each memory using redundancy. A redundancy initialization component is coupled to the one or more voltage islands and the one or more non-power cycled regions.

17 Claims, 4 Drawing Sheets

MANAGING REDUNDANT MEMORY IN A VOLTAGE ISLAND

BACKGROUND

This disclosure relates generally to redundant memory and voltage island configurations, and more specifically to a semiconductor device and semiconductor device design structure that manages redundant memory in a voltage island.

Redundant memory involves placing extra rows and columns into memory such as random access memory (RAM). Because RAMs are susceptible to the slightest defects in the underlying silicon during fabrication, the extra rows and columns can be used to aid in the repair of these defects. The redundancy makes these RAMs usable despite having small defects and thus prevents having to discard a device containing several RAMs if one or more has a minor defect that can be repaired.

Although a voltage island can be used in a couple of different capacities, a typical voltage island is a region of an integrated circuit that can be powered on and off independently of the rest of the components of the integrated circuit. One particular area where a voltage island that operates in this capacity is suitable for use is with cellular phones. Generally, when a cellular phone is not in use, approximately 98% of its integrated circuit components are turned off and the remaining 2% of the components are kept powered up, waiting for a call to come in or for a user to press the phone keypad to initiate a call. Receiving a call or pressing the telephone keypad will initialize the rest of the components within the integrated circuit.

The integrated circuit components that are used in a cellular phone can have more than one voltage island containing more than one RAM with redundancy that functions as a region that is power cycled (i.e., turned on and off) and one or more non-power cycled regions (i.e., always on) that has more than one RAM with redundancy. Determining how best to distribute repair data and update the redundant RAMs with the data is a challenge because manufacturers do not want to use configurations that will waste area by increasing integrated circuit components and thus increase costs or increase power usage by needlessly having additional components remain always on.

SUMMARY

In one embodiment, there is a semiconductor device that comprises one or more voltage islands representing a power cycled region. Each of the one or more voltage islands comprises at least one memory using redundancy and a repair register associated with each memory using redundancy. One or more non-power cycled regions are located about the one or more voltage islands. Each of the one or more non-power cycled regions comprises at least one memory using redundancy and a repair register associated with each memory using redundancy. A redundancy initialization component is coupled to the one or more voltage islands and the one or more non-power cycled regions. The redundancy initialization component is configured to initialize each memory using redundancy and associated repair register with repair data. The redundancy initialization component is configured to initialize a memory using redundancy and associated repair register with repair data independent of, or in conjunction with, the initialization of other memories using redundancy and associated repair registers.

In a second embodiment, there is a design structure embodied in a machine readable medium used in a design process of a semiconductor device. The design structure comprises one or more voltage islands representing a power cycled region. Each of the one or more voltage islands comprises at least one memory using redundancy and a repair register associated with each memory using redundancy. One or more non-power cycled regions are located about the one or more voltage islands. Each of the one or more non-power cycled regions comprises at least one memory using redundancy and a repair register associated with each memory using redundancy. A redundancy initialization component is coupled to the one or more voltage islands and the one or more non-power cycled regions. The redundancy initialization component is configured to initialize each memory using redundancy and associated repair register with repair data. The redundancy initialization component is configured to initialize a memory using redundancy and associated repair register with repair data independent of, or in conjunction with, the initialization of other memories using redundancy and associated repair registers.

DETAILED DESCRIPTION

Figure 1:
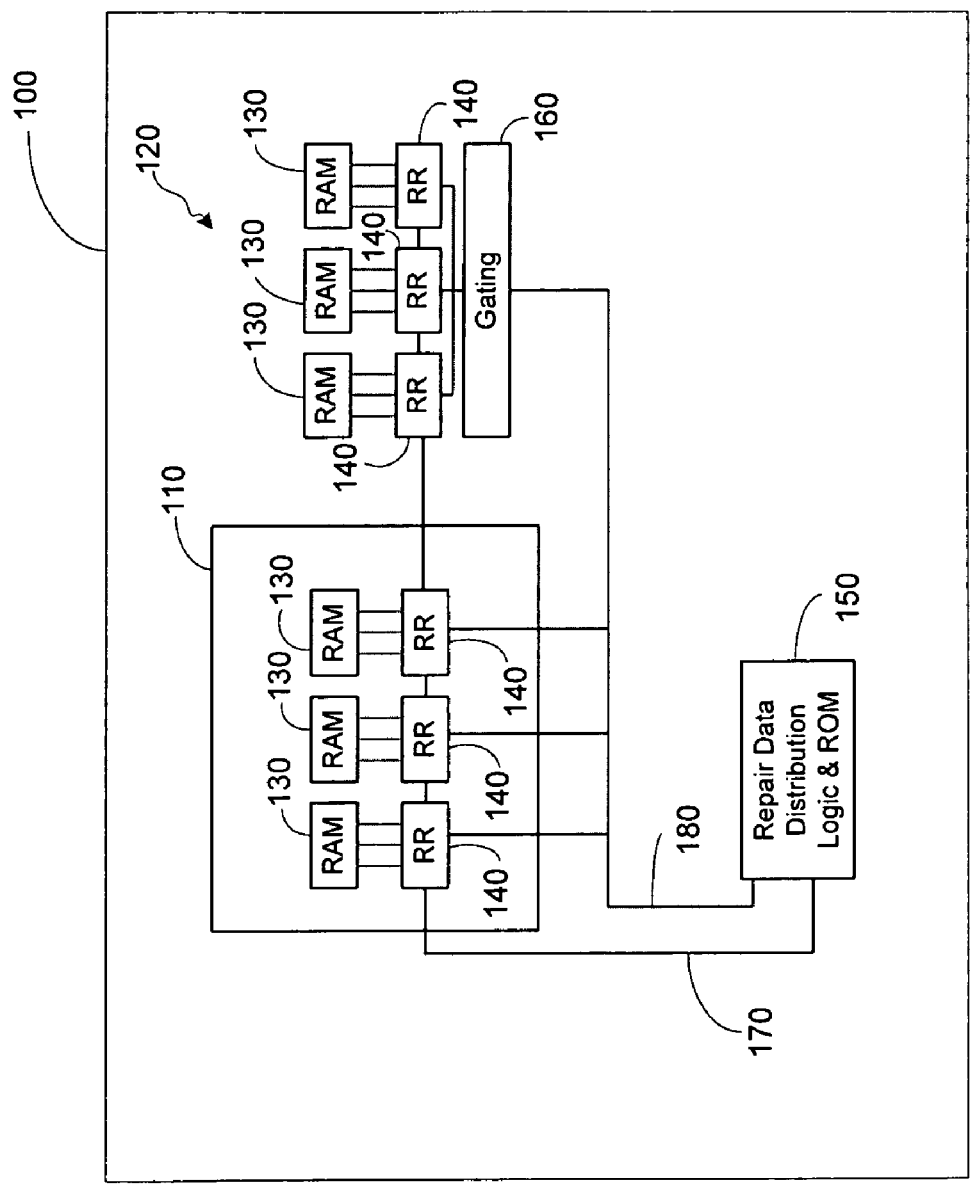
FIG. 1 shows a semiconductor device that manages redundant memory in a voltage island according to one embodiment of this disclosure.

FIG. 1 shows a semiconductor device 100 that manages redundant memory in a voltage island according to one embodiment of this disclosure. Although the description that follows is directed to applying the semiconductor device 100 to a cellular phone application, those skilled in the art will recognize that this device is suitable for use in other areas where it is necessary to update redundant RAMs with repair data.

The semiconductor device 100 of FIG. 1 comprises a voltage island 110 that is a power cycled region (i.e., turned on and off) and a non-power cycled region (i.e., always on) 120. Both the voltage island 110 and the non-power cycled region 120 include more than one redundant RAM 130 and more than one repair register 140. Each repair register 140 is associated with a respective redundant RAM 130. The semiconductor device 100 further includes repair data distribution logic and read-only-memory (ROM) 150 and gating logic 160 that collectively form a redundancy initialization component. The redundancy initialization component is coupled to the voltage island 110 and the non-power cycled region 120. In this embodiment, the gating logic 160 is coupled to the non-power cycled region 120. The repair data distribution logic and ROM 150 uses a serial bus 170 and several clocking and control signals 180 to manage or control the update of repair data to voltage island 110 and non-power cycled region 120. In one embodiment, the clocking and control signals 180 comprise two clocking signals and two control signals that are gated. Those skilled in the art will recognize that the number of clocking signals and control signals can vary. The redundancy initialization component (i.e., the repair data distribution logic and ROM 150 gating logic 160, serial bus 170 and clocking/control signals 180) is configured to initialize each redundant RAM 130 with repair data via its associated repair register 140.

As explained below, the redundancy initialization component is configured to initialize a redundant RAM 130 and associated repair register 140 with repair data independent of, or in conjunction with, the initialization of other redundant RAMs 130 and associated repair registers 140. In particular, the repair data distribution logic and ROM 150 use the serial bus 170 to distribute the repair data to the repair registers 140 and clocking/control signals 180 to control the distribution of the repair data from the repair register 140 to its associated redundant RAM 130. Note that the clocking/control signals 180 and the gating logic 160 are used to control the distribution of the repair data from the repair registers 140 to its associated redundant RAM 130 within the non-power cycled region.

Generally there are two scenarios of operation for the semiconductor device 100 of FIG. 1. One scenario is that the semiconductor device 100 is turned on when the cellular phone is turned on (i.e., the voltage island 110 and the non-power cycled region 120 both are powered from off to on). The repair data distribution logic and ROM 150 distribute the repair data to the repair registers 140 via the serial bus 170. In particular, the distribution logic reads the repair data out from the ROM and sends it along the serial bus 170. More specifically, the repair data goes to the first repair register 140 on the left-hand side of the voltage island 110 and is shifted to the middle repair register 140 in the voltage island and then to the repair register on the right-hand side of the island. Because the non-power cycled region 120 is being powered on, the gating logic 160 will be configured to allow repair data and control signals to pass from the repair register 140 on the right-hand side of voltage island 110 to the registers in the non-power cycled region 120. Eventually, the repair data is shifted to the last repair register 140 on the right-hand side of the non-power cycled region 120. Note that essentially the serial bus of repair registers 140 forms a long shift register.

Once all bits of repair data have been loaded in the repair registers 140 (i.e., the shift register), the repair data distribution logic pulses one of the clocking/control signals 180 causing the contents of the shift register to transfer to another register (not shown in FIG. 1) which will effect repairs to the redundant RAMs 130. Essentially, each repair register 140 contains additional registers (not shown in FIG. 1) that get loaded broad-side once the shift register is fully loaded. These repairs are then loaded from these registers to the redundant RAMs 130 and are kept in place as long as the semiconductor device 100 is powered up. Although the description of the registers that get loaded broad-side is described as being within the repair register 140, those skilled in the art will recognize that these broad-side loaded registers could be either part of the repair register 140 or the redundant RAM 130.

Those skilled in the art will recognize that repair registers can include registers in addition to what has been mentioned heretofore. In particular, the repair registers 140 can include zero or more parallel loadable registers that are loaded based on the clocking/control signals 180. In the case of zero parallel loadable registers, the shift register is connected in parallel to the redundant RAMs 130.

In the second scenario of operation, the non-power cycled region 120 is already on and the voltage island 110 is off and will be turned on later in the future. Because the non-power cycled region 120 is already on, there is no need to disrupt repairs that have been implemented from the repair registers 140 to their respective redundant RAMs 130. Furthermore, reloading the repair registers is disruptive to the function of this always powered region. Because the voltage island 110 is off and will be powered on later in the future, repairs have to be implemented through the repair registers 140 in the voltage island to their respective redundant RAMs 130. In this scenario, the gating logic 160 is configured to prevent repair data and control signals from shifting from the last repair register 140 on the right-hand side of the voltage island 110 to the repair registers associated with the non-power cycled region 120.

As a result, only bits of repair data will be loaded into the repair registers 140 of the voltage island 110. Once all bits of repair data have been loaded in the repair registers 140 of the voltage island 110, the repair data distribution logic pulses the clocking/control signals 180 causing the contents to transfer to the other registers that effect repairs to the redundant RAMs 130. These repairs are then loaded from these registers to the redundant RAMs 130 and are kept in place as long as the voltage island 110 is powered up.

Figure 2:
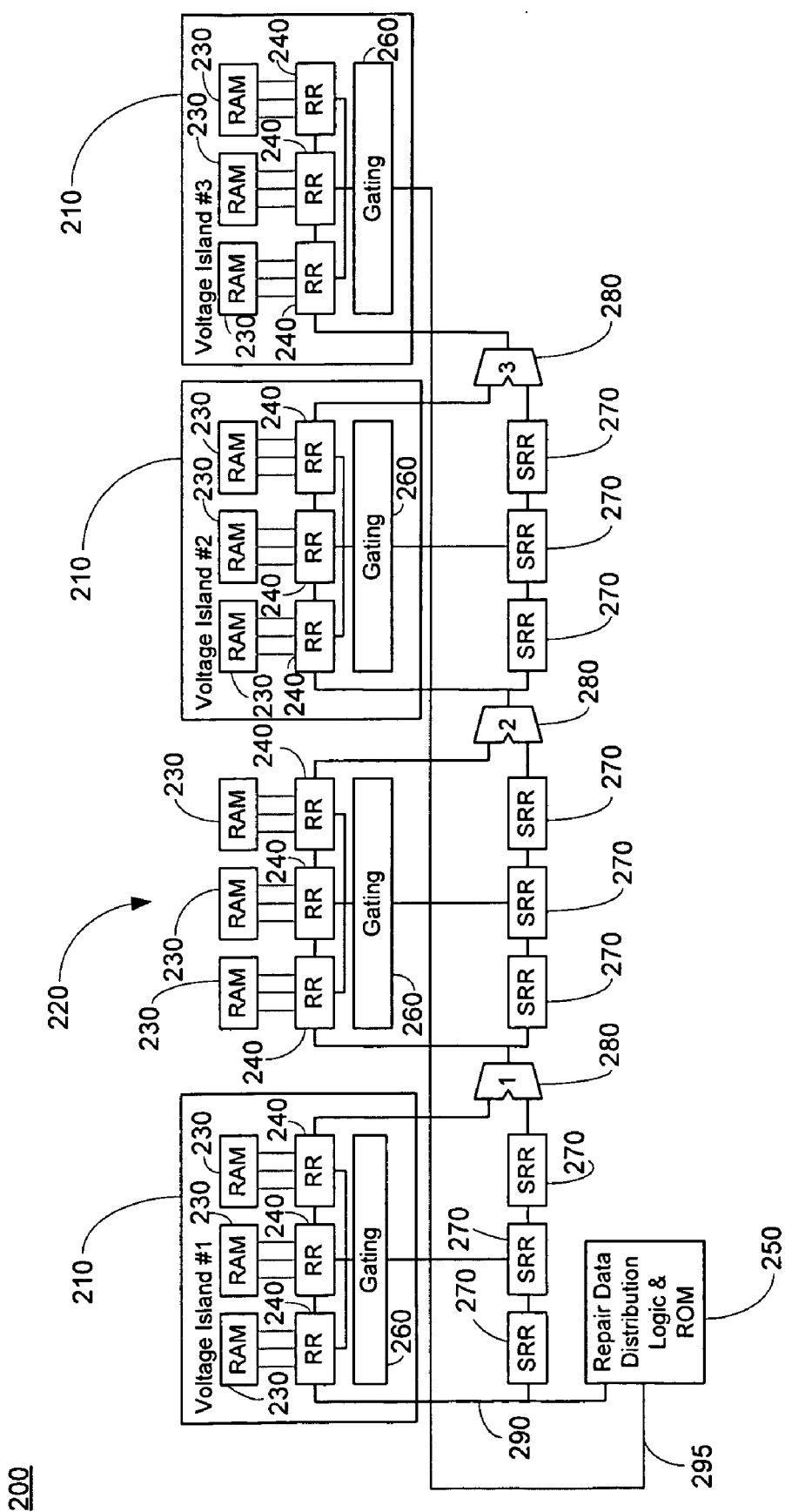
FIG. 2 shows a semiconductor device that manages redundant memory in a voltage island according to an alternative embodiment of this disclosure.

FIG. 2 shows a semiconductor device 200 that manages redundant memory in a voltage island according to an alternative embodiment of this disclosure. The semiconductor device 200 of FIG. 2 comprises three voltage islands (i.e., #1, #2, and #3) 210 and a non-power cycled region 220. Like FIG. 1, the voltage islands 210 and the non-power cycled region 220 include more than one redundant RAM 230 and more than one repair register 240. Each repair register 240 is also associated with a respective redundant RAM 230. The semiconductor device 200 further includes repair data distribution logic and ROM 250 and gating logic 260 that collectively form a redundancy initialization component. The redundancy initialization component is coupled to the voltage islands 210 and the non-power cycled region 220. The redundancy initialization component is configured to initialize each redundant RAM 230 with repair data via its associated repair register 240.

Note that each voltage island 210 as well as the non-power cycled region 220 includes gating logic 260 that is used to control the distribution of the repair data from the repair registers 240 to its associated redundant RAM 230. Below is more of an explanation of the operation of the gating logic 260 in conjunction with the voltage islands 210, non-power cycled region 220 and the repair data distribution logic and ROM 250.

FIG. 2 shows that the semiconductor device 200 further includes shadow repair registers 270 that shadow or mirror the repair registers 240 within the voltage islands 210 and the non-power cycled region 220. Essentially, the shadow repair registers 270 are shift registers of the same number of bits as their corresponding repair register 240. A multiplexer (i.e., multiplexer 1, 2 and 3) 280 switches between the outputs of the shift registers for voltage island #1, non-powered cycled region 220 and voltage island #2. The shadow repair registers 270 shown in FIG. 2 can be used in two situations. One situation is to allow repair registers 240 on some redundant RAMs 230 to be bypassed to avoid disrupting operations of the RAM while maintaining shift register length. The second situation where the shadow repair registers 270 are used is for allowing actual repair registers on some RAMs 230 to be powered down and still be able to reload ones that are not powered down even though they may be later on the chain than the powered down ones. Below is more of an explanation of the operation of the shadow repair registers 270 in conjunction with the voltage islands 210, non-power cycled region 220, the repair data distribution logic and ROM 250 and the gating logic 260.

As explained below, the redundancy initialization component is configured to initialize a redundant RAM 230 and associated repair register 240 with repair data independent of, or in conjunction with, the initialization of other redundant RAMs 230 and associated repair registers 240. In particular, the repair data distribution logic and ROM 250 use a serial bus 290 to distribute the repair data to the repair registers 240 or shadow repair registers 270 and clocking/control signals 295 to control the distribution of the repair data from the repair register 140 and shadow repair registers 270 to its associated redundant RAM 230. Note that the clocking/control signals 295 and the gating logic 260 are used to control the distribution of the repair data to the redundant RAM 230 within each of the voltage islands 210 and the non-power cycled region 220.

There are generally four scenarios of operation for the semiconductor device 200 of FIG. 2. One scenario is that the semiconductor device 200 is turned on when the cellular phone is turned on (i.e., the voltage islands 210 and the non-power cycled region 220 are powered from off to on). The repair data distribution logic and ROM 250 distribute the repair data to the repair registers 240 via the serial bus 290. In particular, the distribution logic reads the repair data out from the ROM and sends it along the serial bus 290. More specifically, the repair data goes to the first repair register 240 on the left-hand side of voltage island #1 and is shifted to the middle repair register 240 in voltage island #1 and then to the repair register on the right-hand side of the island. Because the remaining voltage islands #2 and #3 and the non-power cycled region 220 are being powered on, the gating logic 260 will be configured to allow repair data and control signals to pass from voltage island #1 to non-power cycled region 220 via multiplexer #1 (280), from non-power cycled region 220 to voltage island #2 via multiplexer #2 (280) and from voltage island #2 to voltage island #3 via multiplexer #3 (280).

Once all bits of repair data have been loaded in the repair registers 240 of voltage islands #1, #2, #3 and the non-power cycled region 220, the repair data distribution logic pulses the clocking/control signals 295 causing the contents of the shift register to transfer to another register (not shown in FIG. 2) which will effect repairs to each of the redundant RAMs 230.

In the second scenario of operation of the semiconductor device 200, the non-power cycled region 220 is already on and only voltage island #1 is power cycled from off to on, while voltage islands #2 and #3 remain off. Because the non-power cycled region 220 is already on, there is no need to disrupt repairs that have been implemented from the repair registers 240 to their respective redundant RAMs 230. Because voltage islands #2 and #3 will remain off there is no need update their RAMs with repair data. Only voltage island #1 will have repairs implemented to its redundant RAM 230.

In this scenario, the gating logic 260 associated with voltage island #1 is configured to allow repair data and control signals to pass through the repair registers of voltage island #1, while the gating logic in the non-power cycled region 220 and voltage islands #2 and #3 are configured to prevent the repair data and control signals from passing into these regions. Note that the settings of the multiplexers (1-3) 280 are unimportant.

As a result, only bits of repair data will be loaded into the repair registers 240 of voltage island #1. Once all bits of repair data have been loaded in the repair registers 240 of voltage island #1, the repair data distribution logic pulses the clocking/control signals 295 causing the contents to transfer to the other registers that effect repairs to the redundant RAMs 230. These repairs are then loaded from these registers to the redundant RAMs 230 and are kept in place as long as voltage island #1 is powered up.

In the third scenario of operation, the non-power cycled region 220 is already on and only voltage island #2 is power cycled from off to on, while voltage islands #1 and #3 remain off. Because the non-power cycled region 220 is already on, there is no need to disrupt repairs that have been implemented from the repair registers 240 to their respective redundant RAMs 230. Because voltage islands #1 and #3 will remain off there is no need update their RAMs with repair data. Only voltage island #2 will have repairs implemented to its redundant RAM 230.

In this scenario, the gating logic 260 within voltage island #1 is configured to prevent repair data and control signals from passing into the repair registers 240 of voltage #1. Instead, the repair data distribution logic will distribute repair data from the serial bus 290 through the shadow repair registers 270. Multiplexer #1 passes the repair data to the next set of shadow repair registers 270 associated with the non-power cycled region 220. However, because the non-power cycled region does not need repair updates, the gating logic 260 associated with this region is configured to prevent repair data from traveling through its repair registers 240. Multiplexer #2 is set to pass the repair data from the shadow repair registers associated with the non-power cycled region to the repair registers 240 associated with voltage island #2. Gating logic 260 is configured to pass repair data and control signals to flow to the repair registers 240 of voltage island #2, while the gating logic associated with voltage island #3 is configured to prevent repair data and control signals from shifting into voltage island #3.

As a result, only bits of repair data will be loaded into the repair registers 240 of voltage island #2. Once all bits of repair data have been loaded in the repair registers 240 of voltage island #2, the repair data distribution logic pulses the clocking/control signals 295 causing the contents to transfer to the other registers that effect repairs to the redundant RAMs 230. These repairs are then loaded from these registers to the redundant RAMs 230 and are kept in place as long as the voltage island #2 is powered up.

In the fourth scenario, the non-power cycled region 220 is already on and only voltage island #3 is power cycled from off to on, while voltage islands #1 and #2 remain off. Because the non-power cycled region 220 is already on, there is no need to disrupt repairs that have been implemented from the repair registers 240 to their respective redundant RAMs 230. Because voltage islands #1 and #2 will remain off there is no need to update their RAMs with repair data. Only voltage island #3 will have repairs implemented to its redundant RAM 230.

Like the previous scenario, the gating logic 260 within voltage island #1 is configured to prevent repair data and control signals from being shifted into voltage island #1. The repair data distribution logic will distribute repair data from the serial bus 290 through the shadow repair registers 270. Multiplexer #1 passes the repair data to the next set of shadow repair registers 270 associated with the non-power cycled region 220. Because the non-power cycled region does not need repair updates, the gating logic 260 associated with this region is configured to prevent repair data and control signals from traveling through this region. Multiplexer #2 is set to pass the repair data from the shadow repair registers 270 associated with the non-power cycled region 220 to the shadow repair registers 240 associated with voltage island #2.

Gating logic 260 is configured to prevent repair data and control signals from passing into voltage island #2 and thus the repair data flow through the shadow repair registers 270 associated with voltage island #2. Multiplexer #3 passes data to the repair registers 240 associated with voltage island #3. The gating logic 260 associated with voltage island #3 is configured to pass repair data and control signals into this voltage island so that repair data shift from the repair registers 240 to the redundant RAMs 230 of voltage island #3.

Once all bits of repair data have been loaded in the repair registers 240 of voltage island #3, the repair data distribution logic pulses the clocking/control signals 295 causing the contents to transfer to the other registers that effect repairs to the redundant RAMs 230. These repairs are then loaded from these registers to the redundant RAMs 230 and are kept in place as long as the voltage island #3 is powered up.

The redundancy initialization component associated with semiconductor device 100 (FIG. 1) and semiconductor 200 (FIG. 2) have several functionalities in common. One is that the redundancy initialization component in each embodiment is configured to initialize each voltage island with repair data in one operation. In addition, the redundancy initialization component in each embodiment is configured to initialize each voltage island with repair data independent of the initialization of other voltage islands and non-power cycled regions. Also, the redundancy initialization component in each embodiment is configured to initialize a group of voltage islands independent of the initialization of voltage islands that are distinct from the group of voltage islands.

Figure 3:
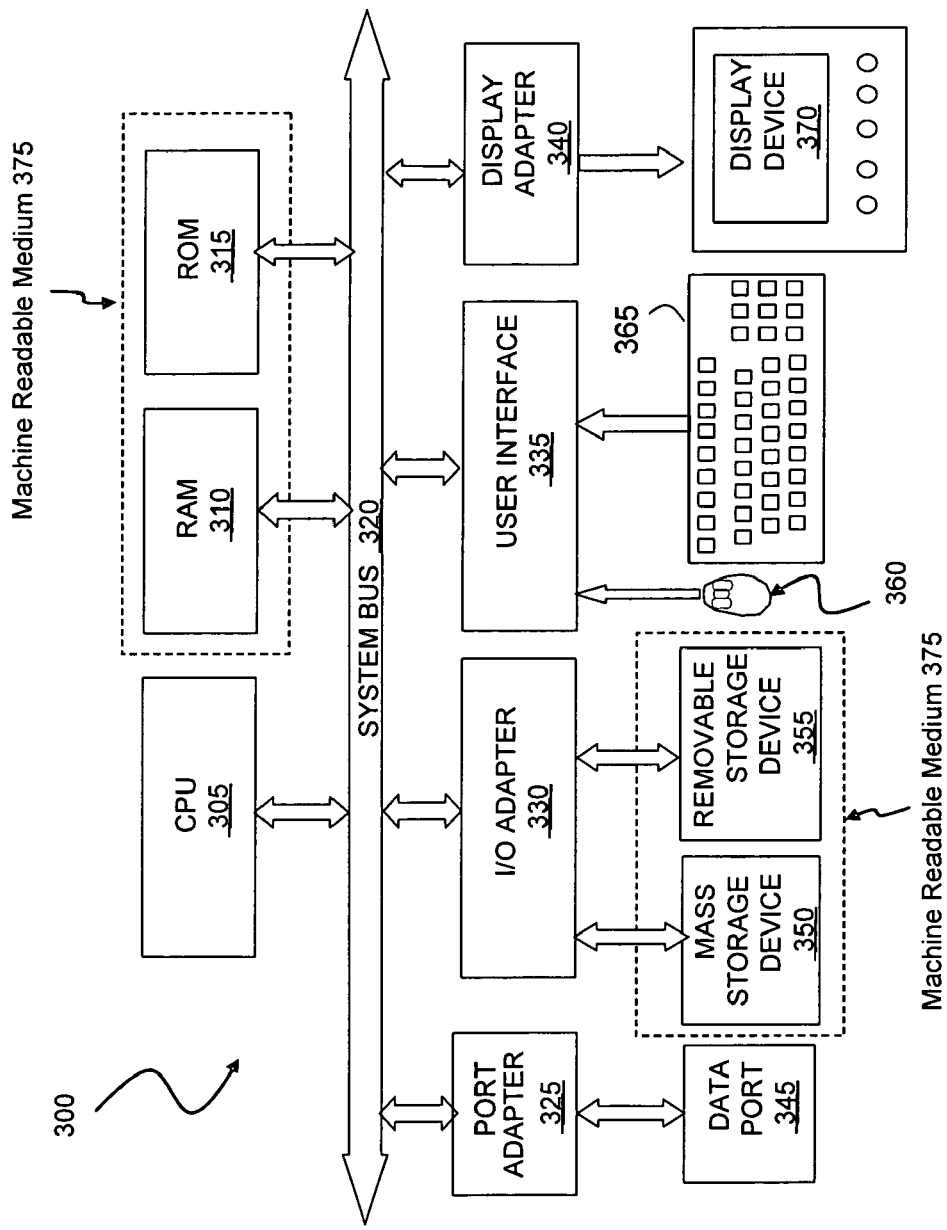
FIG. 3 shows a block diagram of a general-purpose computer system which can be used to implement the semiconductor devices and semiconductor device design structures shown in FIGS. 1 and 2.

FIG. 3 illustrates a block diagram of a general-purpose computer system which can be used to implement the semiconductor devices and semiconductor device design structures described herein. The design structure may be coded as a set of instructions on removable or hard media for use by general-purpose computer. FIG. 3 is a schematic block diagram of a general-purpose computer for practicing the present invention. FIG. 3 shows a computer system 300, which has at least one microprocessor or central processing unit (CPU) 305. CPU 305 is interconnected via a system bus 320 to machine readable medium 375, which includes, for example, a random access memory (RAM) 310, a read-only memory (ROM) 315, a removable and/or program storage device 355 and a mass data and/or program storage device 350. An input/output (I/O) adapter 330 connects mass storage device 350 and removable storage device 355 to system bus 320. A user interface 335 connects a keyboard 365 and a mouse 360 to system bus 320, and a port adapter 325 connects a data port 345 to system bus 320 and a display adapter 340 connects a display device 370. ROM 315 contains the basic operating system for computer system 300. Examples of removable data and/or program storage device 355 include magnetic media such as floppy drives, tape drives, portable flash drives, zip drives, and optical media such as CD ROM or DVD drives. Examples of mass data and/or program storage device 350 include hard disk drives and non-volatile memory such as flash memory. In addition to keyboard 365 and mouse 360, other user input devices such as trackballs, writing tablets, pressure pads, microphones, light pens and position-sensing screen displays may be connected to user interface 335. Examples of display device 370 include cathode-ray tubes (CRT) and liquid crystal displays (LCD).

A machine readable computer program may be created by one of skill in the art and stored in computer system 300 or a data and/or any one or more of machine readable medium 375 to simplify the practicing embodiments of this invention. In operation, information for the computer program created to run embodiments of the present invention is loaded on the appropriate removable data and/or program storage device 355, fed through data port 345 or entered using keyboard 365. A user controls the program by manipulating functions performed by the computer program and providing other data inputs via any of the above mentioned data input means. Display device 370 provides a means for the user to accurately control the computer program and perform the desired tasks described herein.

Figure 4:
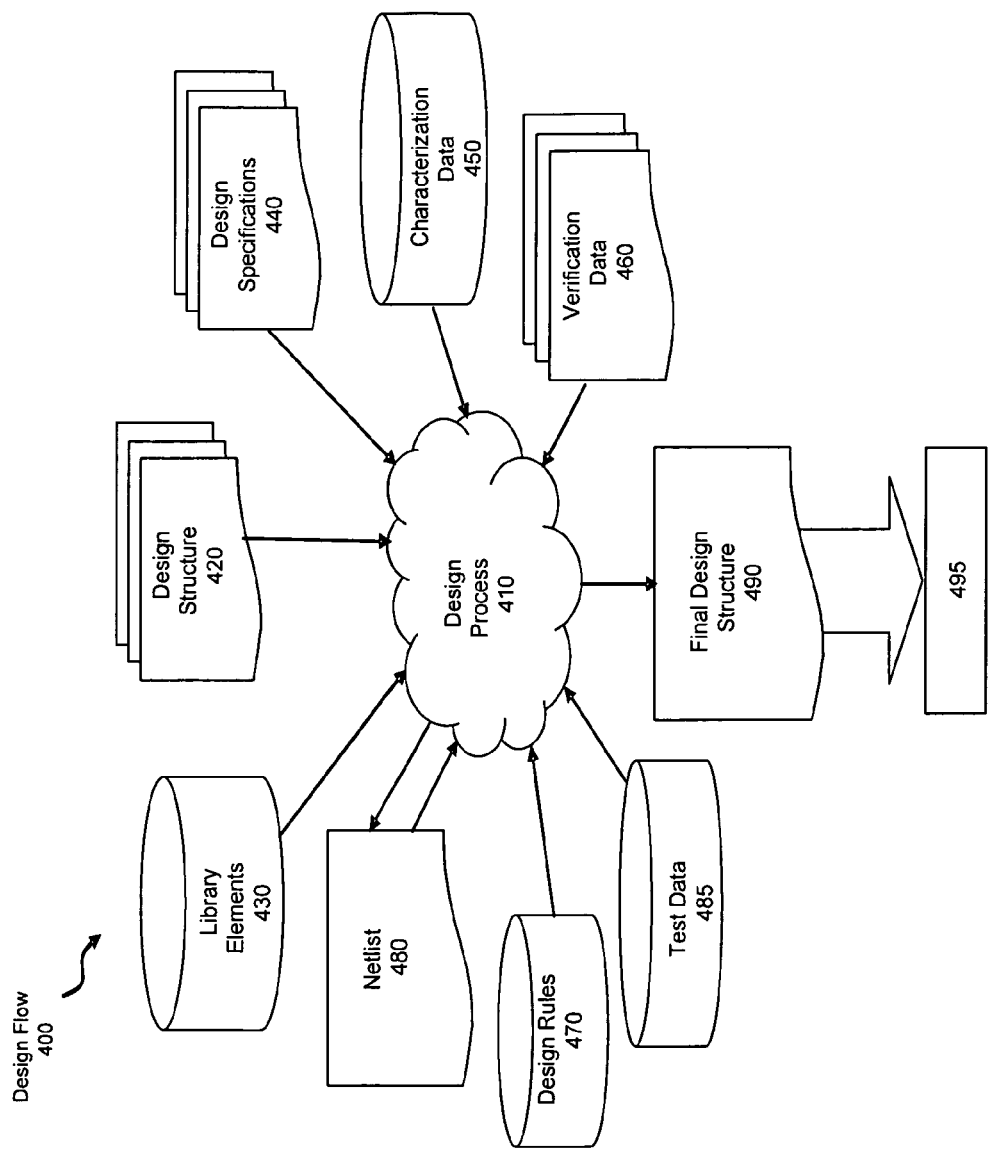
FIG. 4 shows a flow diagram describing a design process that can be used in the semiconductor design, manufacturing and/or test of the semiconductor device shown in FIG. 1.

FIG. 4 shows a block diagram of an example design flow 400. Design flow 400 may vary depending on the type of IC being designed. For example, a design flow 400 for building an application specific IC (ASIC) will differ from a design flow 400 for designing a standard component. Design structure 420 is an input to a design process 410 and may come from an IP provider, a core developer, or other design company. Design structure 420 comprises either the semiconductor device 100 shown in FIG. 1 or the semiconductor device 200 shown in FIG. 2 in the form of schematics or HDL, a hardware-description language, (e.g., Verilog, VHDL, C, etc.). Design structure 420 may be on one or more of machine readable medium 375 as shown in FIG. 3. For example, design structure 420 may be a text file or a graphical representation of the semiconductor devices 100 and 200. Design process 410 synthesizes (or translates) the semiconductor devices into a netlist 480, where netlist 480 is, for example, a list of wires, transistors, logic gates, control circuits, I/O, models, etc., and describes the connections to other elements and circuits in an integrated circuit design and recorded on at least one of machine readable medium 375.

Design process 410 includes using a variety of inputs; for example, inputs from library elements 430 which may house a set of commonly used elements, circuits, and devices, including models, layouts, and symbolic representations, for a given manufacturing technology (e.g. different technology nodes, 32 nm, 45 nm, 90 nm, etc.), design specifications 440, characterization data 450, verification data 460, design rules 470, and test data files 485, which may include test patterns and other testing information. Design process 410 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 410 without deviating from the scope and spirit of the invention.

Ultimately design process 410 translates the semiconductor devices 100 and 200 along with the rest of the integrated circuit design (if applicable), into a final design structure 490 (e.g., information stored in a GDS storage medium). Final design structure 490 may comprise information such as, for example, test data files, design content files, manufacturing data, layout parameters, wires, levels of metal, vias, shapes, test data, data for routing through the manufacturing line, and any other data required by a semiconductor manufacturer to produce the circuit 100. Final design structure 490 may then proceed to a stage 495 of design flow 400, where stage 495 is, for example, where final design structure 490 proceeds to tape-out, i.e., is released to manufacturing, is sent to another design house or is sent back to the customer.

It is apparent that there has been provided with this disclosure a circuit and circuit design structure that manages redundant memory in a voltage island. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A semiconductor device, comprising:
   one or more voltage islands representing a power cycled region, wherein each of the one or more voltage islands comprises at least one memory using redundancy and a repair register associated with each memory using redundancy;
   one or more non-power cycled regions located about the one or more voltage islands, wherein each of the one or more non-power cycled regions comprises at least one memory using redundancy and a repair register associated with each memory using redundancy; and
   a redundancy initialization component, coupled to the one or more voltage islands and the one or more non-power cycled regions, wherein the redundancy initialization component is configured to initialize each memory using redundancy and associated repair register with repair data, wherein the redundancy initialization component is configured to initialize a memory using redundancy and associated repair register with repair data independent of, or in conjunction with, the initialization of other memories using redundancy and associated repair registers.

2. The semiconductor device according to claim 1, wherein the redundancy initialization component comprises gating logic configured to selectively prevent some memories using redundancy and associated repair registers from receiving the repair data.

3. The semiconductor device according to 1, further comprising one or more shadow repair registers coupled to the one or more voltage islands and the one or more non-power cycled regions, wherein each repair register associated with memory using redundancy comprises a corresponding shadow repair register.

4. The semiconductor device according to claim 1, wherein the redundancy initialization component comprises repair data distribution logic configured to distribute the repair data to each repair register associated with memory using redundancy.

5. The semiconductor device according to claim 1, wherein the redundancy initialization component is configured to initialize each of the one or more voltage islands with repair data in one operation.

6. The semiconductor device according to claim 1, wherein the redundancy initialization component is configured to initialize each of the one or more voltage islands with repair data independent of the initialization of other voltage islands and the one or more non-power cycled regions.

7. The semiconductor device according to claim 1, wherein the redundancy initialization component is configured to initialize a group of voltage islands from within the one or more voltage islands independent of the initialization of voltage islands that are distinct from the group of voltage islands.

8. A design structure embodied in a machine readable medium used in a design process of a semiconductor device, the design structure comprising:
   one or more voltage islands representing a power cycled region, wherein each of the one or more voltage islands comprises at least one memory using redundancy and a repair register associated with each memory using redundancy;
   one or more non-power cycled regions located about the one or more voltage islands, wherein each of the one or more non-power cycled regions comprises at least one memory using redundancy and a repair register associated with each memory using redundancy; and
   a redundancy initialization component, coupled to the one or more voltage islands and the one or more non-power cycled regions, wherein the redundancy initialization component is configured to initialize each memory using redundancy and associated repair register with repair data, wherein the redundancy initialization component is configured to initialize a memory using redundancy and associated repair register with repair data independent of, or in conjunction with, the initialization of other memories using redundancy and associated repair registers.

9. The design structure of claim 8, wherein a final design structure comprises a netlist which describes the semiconductor device.

10. The design structure of claim 8, wherein a final design structure resides on a GDS storage medium.

11. The design structure of claim 8, wherein a final design structure includes test data files, characterization data, verification data or design specifications.

12. The design structure according to claim 8, wherein the redundancy initialization component comprises gating logic configured to selectively prevent some memories using redundancy and associated repair registers from receiving the repair data.

13. The design structure according to 8, further comprising one or more shadow repair registers coupled to the one or more voltage islands and the one or more non-power cycled regions, wherein each repair register associated with memory using redundancy comprises a corresponding shadow repair register.

14. The design structure according to claim 8, wherein the redundancy initialization component comprises repair data distribution logic configured to distribute the repair data to each repair register associated with memory using redundancy.

15. The design structure according to claim 8, wherein the redundancy initialization component is configured to initialize each of the one or more voltage islands with repair data in one operation.

16. The design structure according to claim 8, wherein the redundancy initialization component is configured to initialize each of the one or more voltage islands with repair data independent of the initialization of other voltage islands and the one or more non-power cycled regions.

17. The design structure according to claim 8, wherein the redundancy initialization component is configured to initialize a group of voltage islands from within the one or more voltage islands independent of the initialization of voltage islands that are distinct from the group of voltage islands.

* * * * *